United States Patent
Zhao et al.

(10) Patent No.: US 11,436,101 B2
(45) Date of Patent: Sep. 6, 2022

(54) REBUILD DIRECTORY/BLOCK ALLOCATION MAP FROM EMBEDDED DATA BLOCK INFORMATION IN FILE SYSTEM DISK

(71) Applicant: Samsung Electronics Co., Ltd., Suwon-si (KR)

(72) Inventors: Jian Zhao, Hayward, CA (US); Hui-Juan Li, San Jose, CA (US); Rong Zheng, San Jose, CA (US)

(73) Assignee: SAMSUNG ELECTRONICS CO., LTD.

( * ) Notice: Subject to any disclaimer, the term of this patent is extended or adjusted under 35 U.S.C. 154(b) by 350 days.

(21) Appl. No.: 16/712,984

(22) Filed: Dec. 12, 2019

(65) Prior Publication Data

US 2021/0089409 A1 Mar. 25, 2021

Related U.S. Application Data

(60) Provisional application No. 62/902,947, filed on Sep. 19, 2019.

(51) Int. Cl.
| | |
|---|---|
| *G06F 11/00* | (2006.01) |
| *G06F 11/14* | (2006.01) |
| *H03M 13/09* | (2006.01) |
| *G06F 11/10* | (2006.01) |

(52) U.S. Cl.
CPC ...... *G06F 11/1469* (2013.01); *G06F 11/1016* (2013.01); *G06F 11/1435* (2013.01); *H03M 13/095* (2013.01); *G06F 2201/82* (2013.01)

(58) Field of Classification Search
CPC ............. G06F 11/1469; G06F 11/1435; G06F 11/1016; H03M 13/095
See application file for complete search history.

(56) References Cited

U.S. PATENT DOCUMENTS

| | | | |
|---|---|---|---|
| 2015/0058539 A1* | 2/2015 | Huang | G06F 16/2228 711/103 |
| 2016/0085797 A1 | 3/2016 | Patiejunas et al. | |
| 2017/0010823 A1 | 1/2017 | Tomlin et al. | |
| 2018/0018218 A1* | 1/2018 | Rat | G06F 3/0673 |
| 2019/0188088 A1 | 6/2019 | Muller et al. | |

FOREIGN PATENT DOCUMENTS

WO WO-2015048140 A1 * 4/2015 .......... G06F 11/2094

OTHER PUBLICATIONS

Jung, Sanghyuk et al., Data loss recovery for power failure in flash memory storage systems, 2014, Elsevier B.V., Journal of Systems Architecure 61 (Year: 2014).*

* cited by examiner

*Primary Examiner* — Marc Duncan
(74) *Attorney, Agent, or Firm* — Renaissance IP Law Group LLP

(57) ABSTRACT

According to one general aspect, an apparatus may include a storage element configured to store both data and metadata, wherein each piece of data is associated with and stored with a corresponding piece of metadata. The apparatus may include a controller processor. The controller processor may be configured to, in response to a piece of data being written to the apparatus: generate a piece of metadata that includes a set of parameters to facilitate a at least partial repair of a block information map, and embed the piece of metadata with the corresponding piece of data.

20 Claims, 6 Drawing Sheets

REBUILD DIRECTORY/BLOCK ALLOCATION MAP FROM EMBEDDED DATA BLOCK INFORMATION IN FILE SYSTEM DISK

CROSS-REFERENCE TO RELATED APPLICATION

This application claims priority under 35 U.S.C. § 119 to Provisional Patent Application Ser. No. 62/902,947, entitled "REBUILD DIRECTORY/BLOCK ALLOCATION MAP FROM EMBEDDED DATA BLOCK INFORMATION IN FILE SYSTEM" filed on Sep. 19, 2019. The subject matter of this earlier filed application is hereby incorporated by reference.

TECHNICAL FIELD

This description relates to computer storage, and more specifically to an apparatus and method to rebuild a directory/block allocation map from embedded data block information in a file system.

BACKGROUND

In computing, a file system or filesystem (often abbreviated to fs), controls how data is stored and retrieved. Without a file system, information placed in a storage medium would be one large body of data with no way to tell where one piece of information stops and the next begins. By separating the data into pieces and giving each piece a name, the information is easily isolated and identified. Taking its name from the way paper-based information systems are named, each group of data is called a "file". The structure and logic rules used to manage the groups of information and their names is called a "file system".

There are many kinds of file systems. Each one has different structure and logic, properties of speed, flexibility, security, size and more. Some file systems have been designed to be used for specific applications.

The most widely used file systems is the File Allocation Table (FAT) system and its derivatives, which were used for operating systems for 20 years and is still used for many USB disks. The file uses an index table. The table contains entries for each cluster, a contiguous area of disk storage. Each entry contains either the number of the next cluster in the file, or else a marker indicating end of file, unused disk space, or special reserved areas of the disk. The file system includes a FAT region and a data region. The FAT region stores the directory of where all the files are located in the data region. The Data region stores the data, but in a manner that is generally unorganized without the aid of the FAT.

While many other the file systems—besides FAT—exist, they generally have the same index/dictionary and data region divide, in some format or style. One flaw of this may be that if the directory (or in the case of NAND (Not AND) storage, block information map) becomes corrupt, it may be difficult recover the dictionary state, and therefore, the data in the data region may be lost. Generally, metadata or file related information may not be stored in the data region.

SUMMARY

According to one general aspect, an apparatus may include a storage element configured to store both data and metadata, wherein each piece of data is associated with and stored with a corresponding piece of metadata. The apparatus may include a controller processor. The controller processor may be configured to, in response to a piece of data being written to the apparatus: generate a piece of metadata that includes a set of parameters to facilitate a at least partial repair of a block information map, and embed the piece of metadata with the corresponding piece of data.

According to another general aspect, an apparatus may include a storage element configured to store both data and metadata, wherein each piece of data is associated with and co-stored with a corresponding piece of metadata. The apparatus may include a controller processor. The controller processor ay be configured to, in response to a request to rebuild a block information map: retrieve a plurality of pieces of metadata, each associated with respective pieces of data; sort the plurality of metadata by one or more identifiers; remove, from the plurality of metadata, pieces of metadata that are invalid; and rebuild the block information based upon the remaining plurality of metadata.

According to another general aspect, a system may include a processor configured to read and write pieces of data from a storage device. The system may include a storage device. The storage device may include a storage element configured to store both data and metadata, wherein each piece of data is associated with and stored with a corresponding piece of metadata. The storage device may include a controller processor. The controller processor may be configured to: generate and manage each piece of metadata, in response to a write request for a piece of data, update and store the associated piece of metadata in the same memory block as the piece of data, and rebuild, at least partially, a block information map based, at least in part, upon the pieces of metadata.

The details of one or more implementations are set forth in the accompanying drawings and the description below. Other features will be apparent from the description and drawings, and from the claims.

A system and/or method for computer storage, and more specifically to an apparatus and method to rebuild a directory/block allocation map from embedded data block information in a file system, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Figure 1:
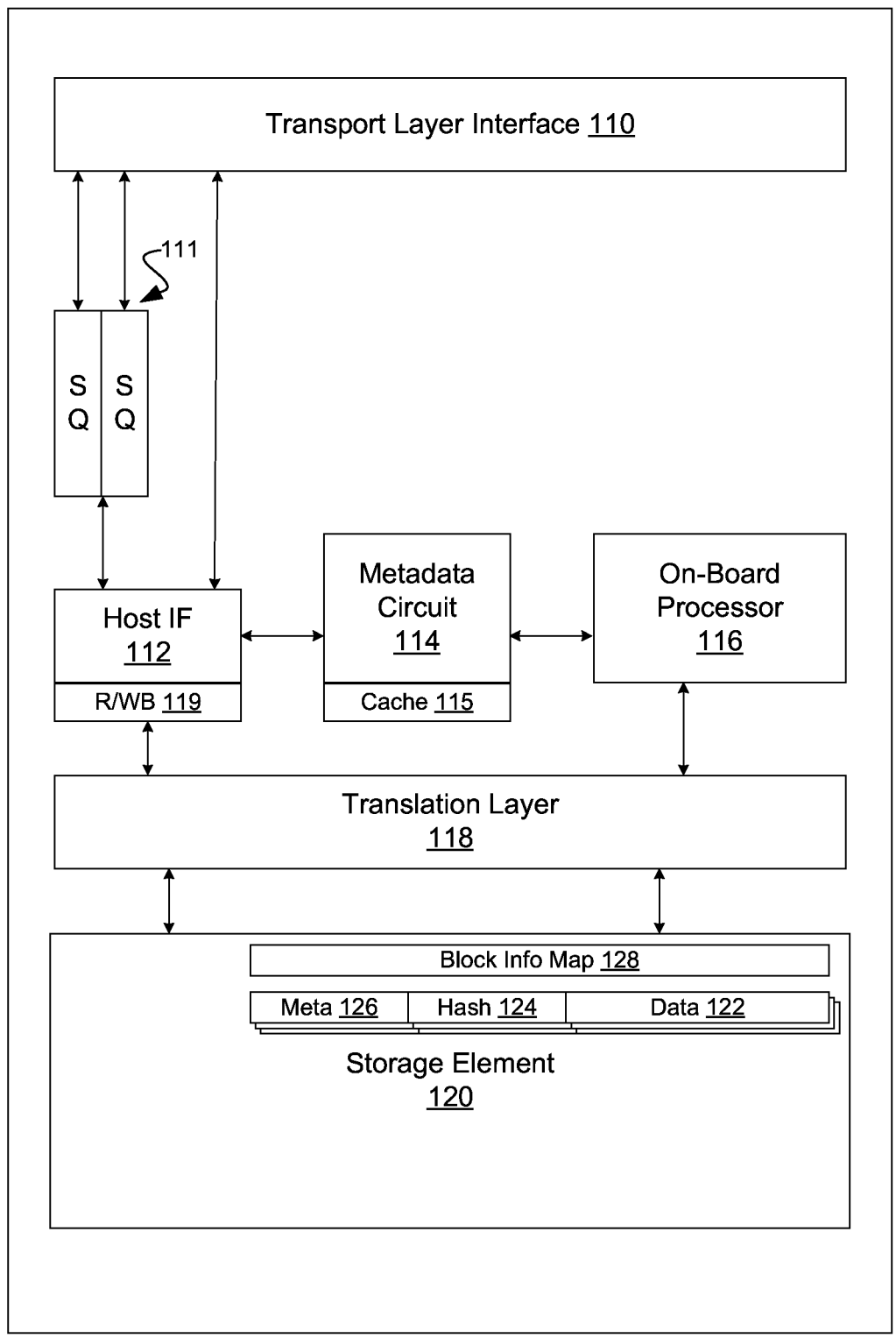
FIG. 1 is a block diagram of an example embodiment of a system for a computer storage, and more specifically to an apparatus and method to rebuild a directory/block allocation map from embedded data block information in a file system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 100 in accordance with the disclosed subject matter. In various embodiments, the system 100 may include a storage device or storage medium (e.g., hard drive, solid state drive, Flash drive, etc.) In various embodiments, the system 100 may be used by or included by a computing device, such as, for example, a laptop, desktop, workstation, datacenter, cloud, personal digital assistant, smartphone, tablet, and other appropriate computers or a virtual machine or virtual computing device thereof.

In the illustrated embodiment, the system 100 may include a transportation layer interface 110. In various embodiments, the system 100 may communicate with the host computing device via a transportation bus, protocol, or layer. In some embodiments, the transportation bus may include Peripheral Component Interconnect Express (PCIe) or another form of communication. It is understood that the above is merely one illustrative example to which the disclosed subject matter is not limited.

In various embodiments, the system 100 may include one or more submission queues (SQs) 111. Each SQ 111 may be configured to store, at least temporarily, read or write commands from the host device.

In the illustrated embodiment, the system 100 may include a host interface circuit 112. In such an embodiment, the host interface circuit 112 may be configured to receive the memory access commands (e.g., read or write) from the host device (not shown), and respond to the host device when those commands have been processed (successfully or not). In general, a memory access command may include a read/write request command or message, and once accepted or fulfilled by responded to by the system 100 sending the host a read/write response command or message.

In the illustrated embodiment, the system 100 may include a translation layer circuit 118. In various embodiments, this may include a flash translation layer (FTL). Although, it is understood that the above is merely one illustrative example to which the disclosed subject matter is not limited.

In various embodiments, the translation layer 118 may be configured to perform low-level management of the memory or storage element 120. In various embodiments, this may include writing (or in the parlance of some technologies "program") data to the storage element 120, wear-leveling to assure that writes are occurring sufficiently uniformly throughout the storage element 120, metadata and/or error correction code generation, and performing garbage collection of recycling invalid storage locations within the storage element 120. In various embodiments, the translation layer 118 may perform logical address block translation. It is understood that the above are merely a few illustrative examples to which the disclosed subject matter is not limited.

In the illustrated embodiment, the system 100 may include a storage element 120. In such an embodiment, the storage element 120 may be configured to store data 122. In various embodiments, the storage element 120 may include one or more storage technologies, such as, for example, NAND storage, ferromagnetic storage, solid state storage (SSD), etc. In the illustrated embodiment, the storage will be described as solid state storage for the sake of illustration. It is understood that the above are merely a few illustrative examples to which the disclosed subject matter is not limited.

In such an embodiment, the storage element 120 may comprise of grouping of planes, which comprise blocks, which in turn comprise pages, which comprise individual memory cells to store the data. In various embodiments, the read/write memory access operations may occur at a page level, whereas erase or garbage collection may occur at the block level. It is understood that the above are merely a few illustrative examples to which the disclosed subject matter is not limited.

As described above, the storage element 120 may store data 122, which is read from and written to by the transition layer 118 and eventually memory access commands issued by a host device (not shown). As described above, in various embodiments, the file system on the storage element 120 may use a dictionary, directory, index, table or other data structure (e.g., a block information map 128) to index or otherwise map files to their actual storage locations (e.g., blocks).

In the illustrated embodiment, the system 100 may be configured to store metadata 126 with the data 122. In some embodiments, the metadata 126 may be referred to as embedded information. In various embodiments, every time the data 122 is stored to the storage element 120, metadata 126 may be calculated and stored with the data 122. The metadata 126 may include or be stored in addition to the hash code 124 or error detection/correction data stored with the data 122. In such an embodiment, the metadata 126 may essentially or substantially be embedded, co-located, or co-stored with the data 122, as opposed to being stored as a separate file or a separate section of the storage element 120 (e.g., as is done with the block information map 128).

In various embodiments, this metadata 126 may be employed to rebuild or repair (at least partially) the block information map 128, if the map 128 becomes damaged. In various embodiments, the metadata 126 may be used to augment or even replace the block information map 128. It is understood that the above are merely a few illustrative examples to which the disclosed subject matter is not limited.

In the illustrated embodiment, the system 100 may include a metadata circuit 114 configured to compile the information in the metadata 126 and generate the metadata 126 itself. The details of the metadata 126 are described in relation to FIG. 2.

In the illustrated embodiment, the system 100 may include an on-broad processor or controller 116 configured to execute one or more instructions for the system 100. In various embodiments, the processor 116 may include an application-specific integrated circuit (ASIC), field-programmable gate array (FPGA), or other processing circuitry. In various embodiments, the processor 116 may be configured to perform, at least partially, the re-building of the block information map 128. The processor 116 may be configured to create one or more parameters of the metadata 126, and the hash code 124. In various embodiments, the processor 116 may direct the activities of the metadata circuit 114 or include the metadata circuit 114.

In the illustrated embodiment, the system 100 may include a cache 115 configured to temporarily store data (and/or metadata) as it is processed by the metadata circuit 114 or the processor 116. In the illustrated embodiment, the system 100 may include read and write buffer memories or circuits 119. The write buffer 119 may be configured to temporarily store data (and/or metadata) while it is in the process of being written to the storage element 120. Conversely, the read buffer 119 may be configured to temporarily store data while it is in the process of being read form the system 100 to the host device. In various embodiments, other temporary or smaller memories may be included in the system 100.

Figure 2:
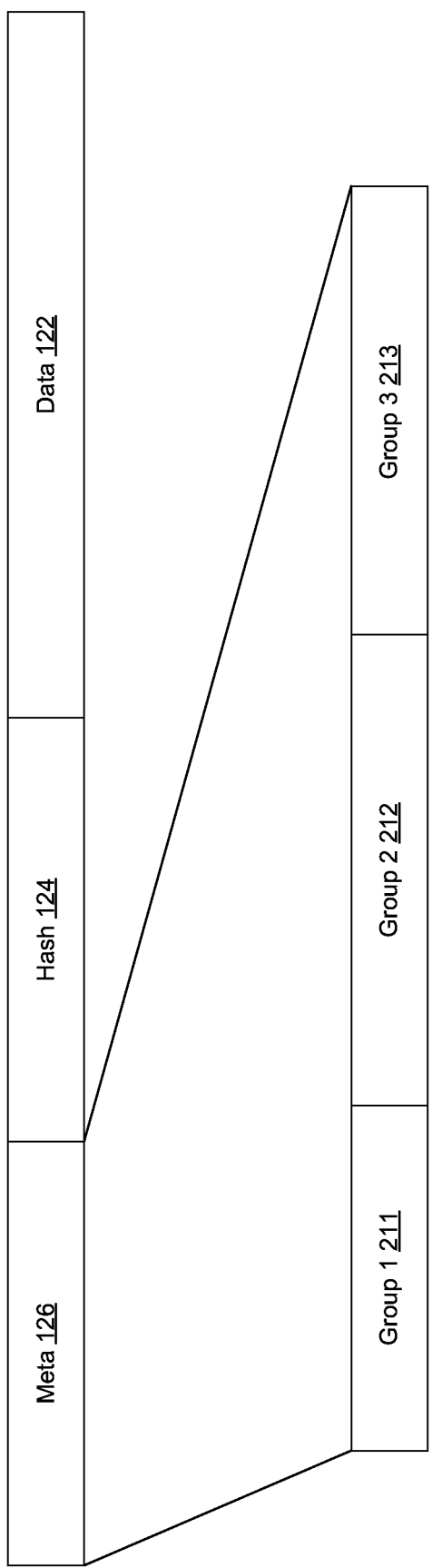
FIG. 2 is a diagram of an example embodiment of a data structure for a computer storage, and more specifically to an apparatus and method to rebuild a directory/block allocation map from embedded data block information in a file system in accordance with the disclosed subject matter.

FIG. 2 is a diagram of an example embodiment of a data structure 200 in accordance with the disclosed subject matter. In various embodiments, the data structure 200 may be stored by a storage element within a storage device or other memory system.

In various embodiments, the data structure 200 may include a data portion 122 and a metadata portion 126. In such an embodiment, the data portion 122 may include the actual data which is the subject of a memory access requires (e.g., read/write) and is reported/provided by a host device for storage in the memory.

Conversely, the metadata portion 126 may include a set of parameters to facilitate an at least partial repair of a block information map, as described above. In one embodiment, the metadata 126 may include various sets or groupings of parameters. In the illustrated embodiment, at least three are shown. It is understood that the above is merely one illustrative example to which the disclosed subject matter is not limited.

In the illustrated embodiment, a first group of parameters 211 may include parameters ordering information associated with the respective piece of data. In various embodiments, the first group 211 may include a fields or parameters, such as, for example, a time stamp (timeStamp), a power cycle counter (pwrCycleCounter), a block order (blockOrder), and a file identifier (ID) (fileID). It is understood that the above are merely a few illustrative examples to which the disclosed subject matter is not limited.

In various embodiments, the time stamp may indicate when a particular write operation started. In various embodiments, this value may be the same during an entire write operation, and as such multiple blocks or pieces of data 122 may be associated with the same time stamp value.

In various embodiments, the power cycle counter may indicate how many clock cycles it has been since the power to the system has been turned on. In various embodiments, the block order field may indicate a sequential order number placing this particular block in the large file (e.g., for files spanning multiple blocks). The file ID may identify which file this data block is associate with or part of.

In the illustrated embodiment, a second group of parameters 212 may include parameters that links the associated piece of data 122 with other pieces of data (e.g., in other blocks). In various embodiments, the second group 212 may include a fields or parameters, for example, a block ID for the previous block in the same file (prevBlockID), a block ID for the next block in the file (nextBlockID), the block order of the first block during the same write operation (firstBlockOrderThisWrite), and the block order of the last block during the same write operation (lastBlockOrderThis- Write). In this context, the block order can include the logical number of a block in the file. For example, if a file size is 64 KB, block size is 4 KB, and the total number of blocks is 16, then the block order is from 0 to 15.

In the illustrated embodiment, a third group of parameters 213 may include parameters detailing information about a size of the piece of data 122. In various embodiments, the third group 213 may include a fields or parameters, such as, for example, the total number of blocks that are included in the file (at the time this version of the file was written) (totalFileBlock), and an actual amount of data used in this block (usedDataBlockSize). It is understood that the above are merely a few illustrative examples to which the disclosed subject matter is not limited.

In various embodiments, the data structure 200 may include a hash code 124 configured to facilitate error detection and/or correction. In various embodiments, the hash code 124 may be included as part of the metadata 126. In some embodiments, the hash code 124 may protect the data portion 122 alone, or both the data 122 and the metadata 126. In some embodiments, the metadata 126 may include a field that indicates whether or not a hash code 124 is included in the data structure 200.

In various embodiments, the data structure 200 may include one block of the file system or storage memory. In one such embodiment, the data 122 may include approximately 8,288 bytes (approximately 8 kilobytes), the hash code 124 four bytes, and the metadata 126 twenty-eight bytes. It is understood that the above is merely one illustrative example to which the disclosed subject matter is not limited.

Further, while the metadata 126 and hash code 124 are shown as a header or in the front of the data 122, in another embodiment, the metadata 126 and hash code 124 may be a footer or placed at the end of the data 122. In another embodiment, the metadata 126 and hash code 124 may bookend the data 122, or even be interleaved with the data 122. Various data structures are contemplated. It is understood that the above is merely one illustrative example to which the disclosed subject matter is not limited.

Figure 3:
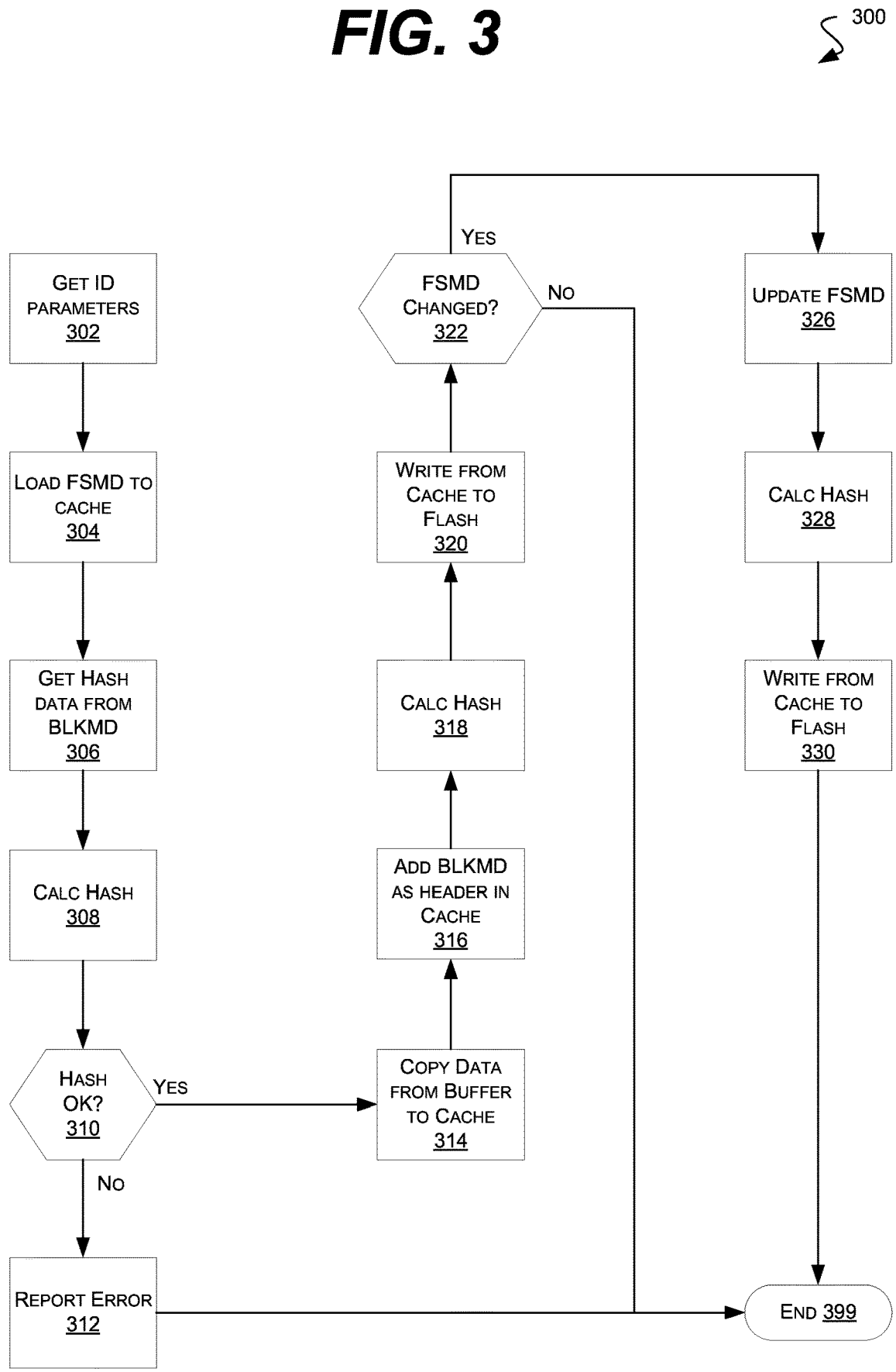
FIG. 3 is a flowchart of an example embodiment of a technique for a computer storage, and more specifically to an apparatus and method to rebuild a directory/block allocation map from embedded data block information in a file system in accordance with the disclosed subject matter.

FIG. 3 is a flowchart of an example embodiment of a technique 300 in accordance with the disclosed subject matter. In one embodiment, the technique 300 may be employed to write data and metadata to the storage device. In various embodiments, this may occur in response to a write request being issued or received by the storage device. In various embodiments, the technique 300 may be performed by the processor, metadata circuit, translation layer or some combination thereof.

Figure 6:
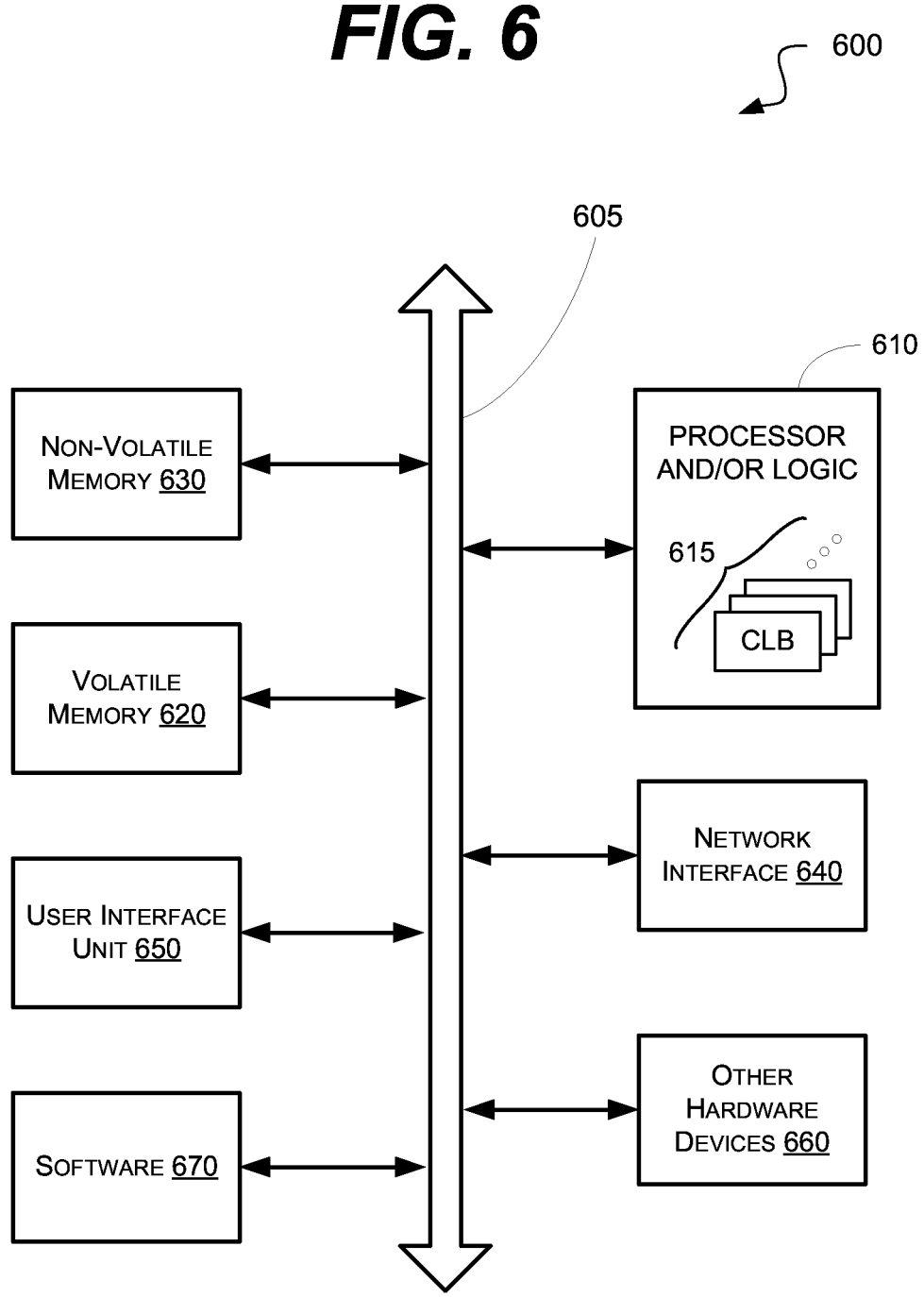
FIG. 6 is a schematic block diagram of an information processing system for a computer storage, and more specifically to an apparatus and method to rebuild a directory/block allocation map from embedded data block information in a file system that may include devices formed according to principles of the disclosed subject matter.

In various embodiments, the technique 300 may be used or produced by the systems such as those of FIG. 1 or 6. Furthermore, portions of technique 300 may use or produce data structures such as that of FIG. 2. Although, it is understood that the above are merely a few illustrative examples to which the disclosed subject matter is not limited. It is understood that the disclosed subject matter is not limited to the ordering of or number of actions illustrated by technique 300.

Block 302 illustrates that, in one embodiment, various parameters may be gathered by the disclosed systems. In various embodiments, this may include parameters like the file ID, the length of the data, and so on. It is understood that the above are merely a few illustrative examples to which the disclosed subject matter is not limited.

Block 304 illustrates that, in one embodiment, a previously stored version of the file system-level metadata (FSMD; e.g., from a prior write operation) may be loaded into the cache or other temporary memory. Such file system-level metadata is usually stored in a separate block, and is used by the file system (similarly to the file allocation table). In various embodiments, this may include retrieving the used data length from the file system metadata. In such an embodiment, this information may be employed as part of the hash code operation.

Block 308 illustrates that, in one embodiment, the hash code may be calculated by the disclosed systems. Block 310 illustrates that, in one embodiment, the calculated hash code may be compared to the actual hash code of the target block. In various embodiments, this may be done to verify the integrity of the stored data. Such a check may be vital if the entire block will not be overwritten as part of this write operation. In various embodiments, the hash code may be retrieved from the block-level metadata (BLKMD), as shown in block 306 and described above in relation to FIG. 2. It is understood that the above is merely one illustrative example to which the disclosed subject matter is not limited.

Block 312 illustrates that, in one embodiment, if the hash code is incorrect, an error may be reported. In various embodiments, the error may take various forms and be handled in various ways. Block 399 illustrates that, in one embodiment, such would be the (unsuccessful in this case) end of the write operation.

Block 314 illustrates that, in one embodiment, the current data may be copied from the write buffer to the cache. Block 316 illustrates that, in one embodiment, the prior block-level metadata may be added (e.g., as a header) to the data.

Block 318 illustrates that, in one embodiment, a new hash code may be calculated. In one embodiment, the hash code may protect only the data portion. In another embodiment, the has code may protect both the data and metadata. This updated hash code may be then added to the data/metadata data structure, as described above. Block 320 illustrates that, in one embodiment, the new data and/or hash code may be written from the cache to the storage element (e.g. NAND memory).

Block 322 illustrates that, in one embodiment, a determination may be made as to whether the file system metadata needs to be changed (e.g., fields updated, etc.). If not, the technique 300 and write operation may end (Block 399). If so, Block 326 illustrates that, in one embodiment, file system metadata may be updated, as described above. Block 328 illustrates that, in one embodiment, the hash code may again be updated, if needed. Block 330 illustrates that, in one embodiment, the new metadata may be written from the cache to the storage element (e.g. NAND memory).

Figure 4:
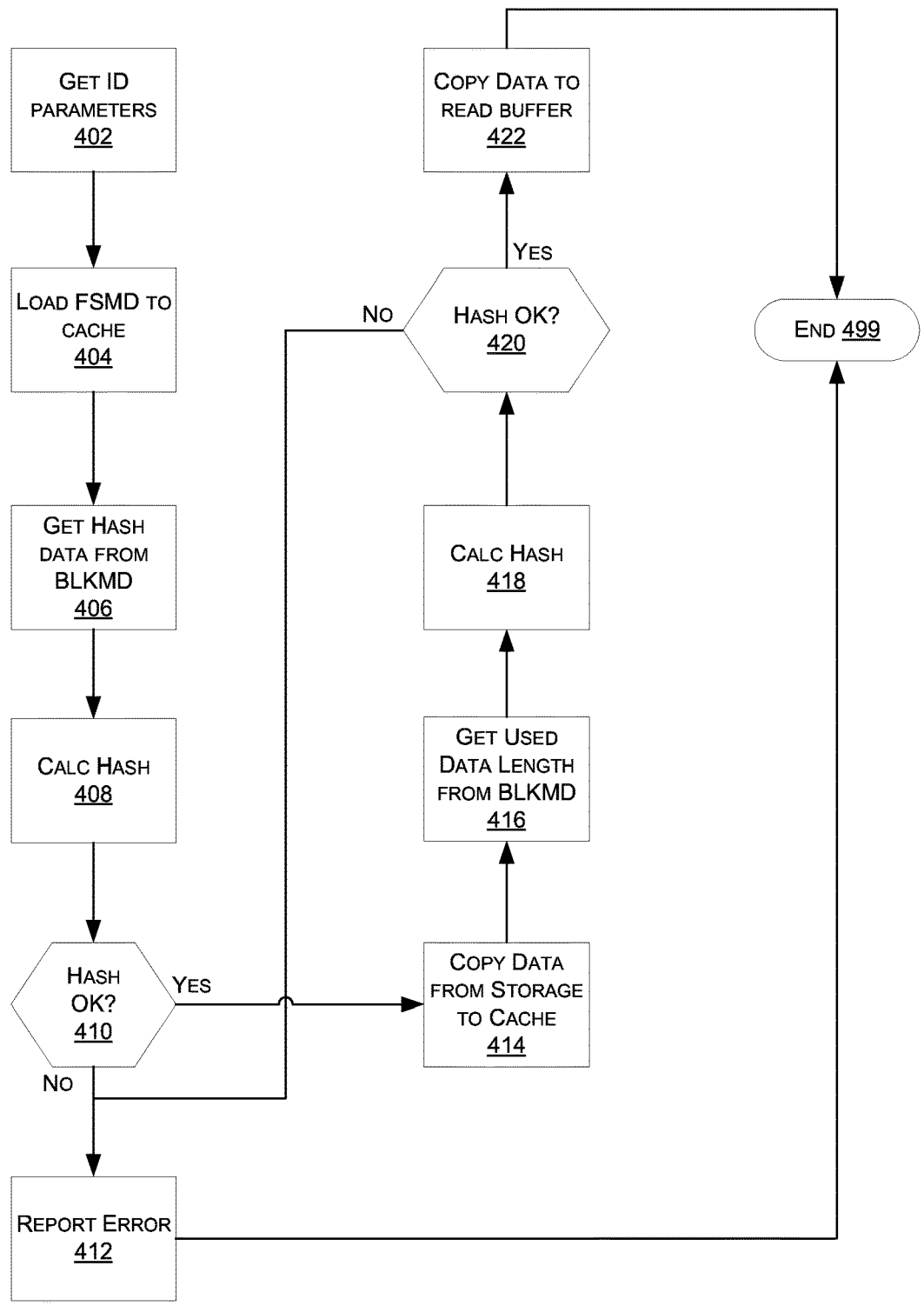
FIG. 4 is a flowchart of an example embodiment of a technique or a computer storage, and more specifically to an apparatus and method to rebuild a directory/block allocation map from embedded data block information in a file system in accordance with the disclosed subject matter.

FIG. 4 is a flowchart of an example embodiment of a technique 400 in accordance with the disclosed subject matter. In one embodiment, the technique 400 may be employed to read data from the storage device. In various embodiments, this may occur in response to a read request being issued or received by the storage device. In various embodiments, the technique 400 may be performed by the processor, metadata circuit, translation layer or some combination thereof.

In various embodiments, the technique 400 may be used or produced by the systems such as those of FIG. 1 or 6. Furthermore, portions of technique 400 may use or produce data structures such as that of FIG. 2. Although, it is understood that the above are merely a few illustrative examples to which the disclosed subject matter is not limited. It is understood that the disclosed subject matter is not limited to the ordering of or number of actions illustrated by technique 400.

Block 402 illustrates that, in one embodiment, various parameters may be gathered. In various embodiments, this may include parameters like the file ID, the length of the data, and so on. It is understood that the above are merely a few illustrative examples to which the disclosed subject matter is not limited.

Block 404 illustrates that, in one embodiment, a previously stored version of the metadata (e.g., from a prior write operation) may be loaded into the cache or other temporary memory. In various embodiments, this may include retrieving the used data length from the metadata. In such an embodiment, this information may be employed as part of the hash code operation.

Block 408 illustrates that, in one embodiment, the hash code may be calculated. Block 410 illustrates that, in one embodiment, the calculated hash code may be compared to the actual hash code of the target block. In various embodiments, this may be done to verify the integrity of the stored data. In various embodiments, the hash code may be retrieved from the block-level metadata (BLKMD), as shown in block 406 and described above in relation to FIG. 2. It is understood that the above is merely one illustrative example to which the disclosed subject matter is not limited.

Block 412 illustrates that, in one embodiment, if the hash code is incorrect, an error may be reported. In various embodiments, the error may take various forms and be handled in various ways. Block 499 illustrates that, in one embodiment, such would be the (unsuccessful in this case) end of the write operation.

Block 414 illustrates that, in one embodiment, the target or desired data may be copied from the storage medium (e.g., NAND memory) to the cache.

Block 416 illustrates that, in one embodiment, the parameters (e.g., the used data length) may be extracted from the metadata and employed in the hash code calculation. Block 418 illustrates that, in one embodiment, a has code may be calculated to confirm or determine that that the data has not been corrupted.

Block 420 illustrates that, in one embodiment, a determination may be made regarding the validity of the hash code. In such an embodiment, this may involve comparing the hash code computed in Block 418 to the hash code stored with the data. If the hash code is incorrect, Block 412 illustrates that, in one embodiment, an error may be reported, as described above. If the hash code is correct, Block 422 illustrates that, in one embodiment, the data may be copied to the read buffer for eventual transfer to the requesting host device. In such an embodiment, neither the metadata nor the hash code may be included in the copying of the data to the requesting host device. In such an embodiment, the metadata and hash code may be for the internal use of the storage medium or device, and may be hidden from the host. It is understood that the above is merely one illustrative example to which the disclosed subject matter is not limited.

Figure 5:
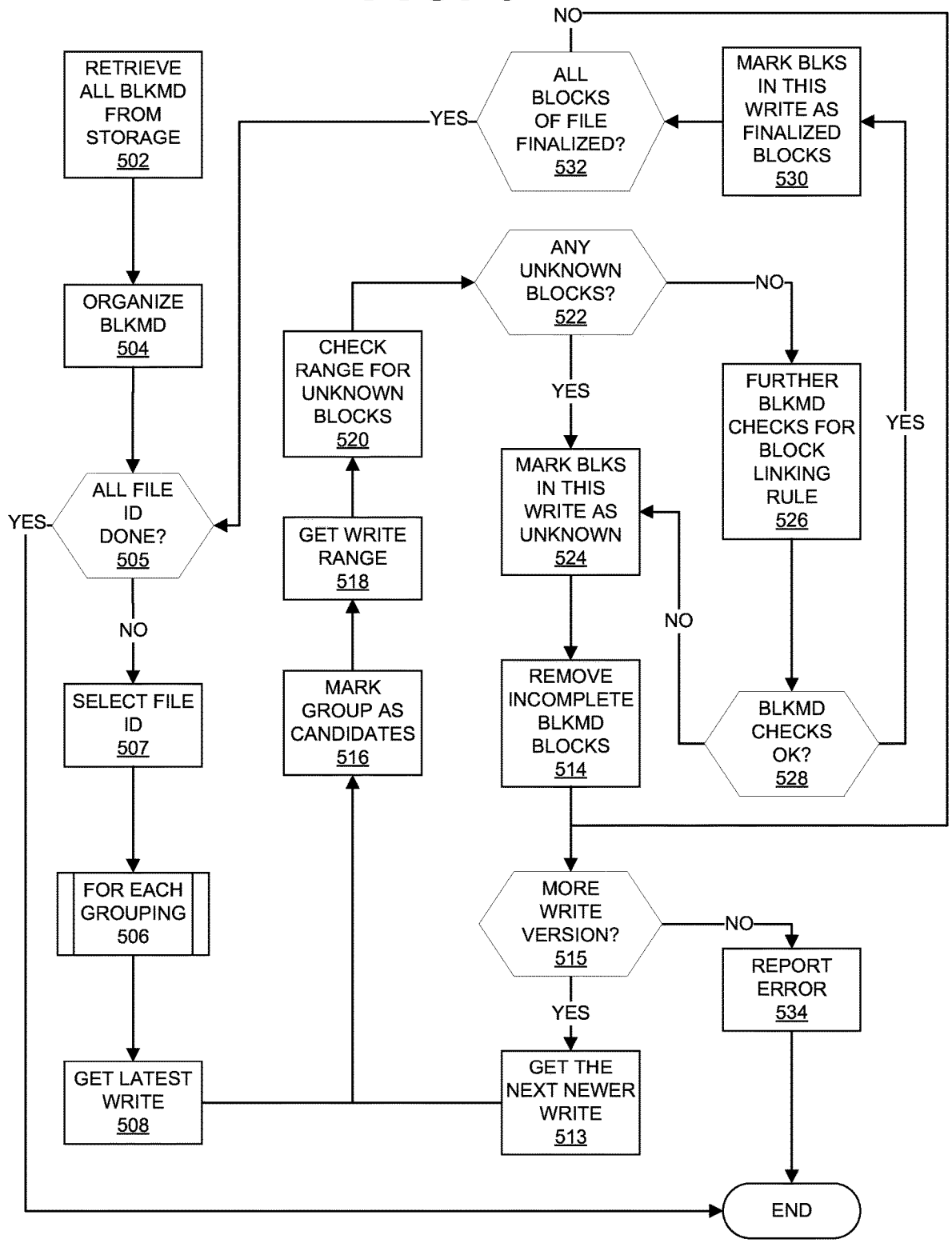
FIG. 5 is a flowchart of an example embodiment of a technique for a computer storage, and more specifically to an apparatus and method to rebuild a directory/block allocation map from embedded data block information in a file system in accordance with the disclosed subject matter.

FIG. 5 is a flowchart of an example embodiment of a technique 500 in accordance with the disclosed subject matter. In one embodiment, the technique 500 may be employed to rebuild or repair the block information map or other index table of a file system or storage system. In various embodiments, the technique 500 may be performed by the processor, metadata circuit, translation layer or some combination thereof.

In various embodiments, the technique 500 may be used or produced by the systems such as those of FIG. 1 or 6. Furthermore, portions of technique 500 may use or produce data structures such as that of FIG. 2. Although, it is understood that the above are merely a few illustrative examples to which the disclosed subject matter is not limited. It is understood that the disclosed subject matter is not limited to the ordering of or number of actions illustrated by technique 500.

As described above, in various embodiments, the block information map or other index table may become corrupted. Examples may include premature disconnection of the storage device, power failure or fluctuation, etc. In such an embodiment, the ability to determine where a particular file is located or stored may no longer be possible. In such an embodiment, the device may attempt to rebuild or repair the block information map using the metadata stored with the data.

In various embodiments, this may include a full rebuild of the map. This technique may then be applied to the full block information map. In another embodiment, this may include a partial repair. For example, the storage device may be able to determine (e.g., using the metadata as a check) the accuracy of the block information map, and determine which portions are corrupted. The storage device may then mark regions of the data as good or corresponding to the un-corrupted portion of the block information map, and others as unknown or possibly corresponding to the corrupted portion of the map. This technique may then be applied to the corrupted portion. It is understood that the above are merely a few illustrative examples to which the disclosed subject matter is not limited.

Block 502 illustrates that, in one embodiment, that all of the meta data be retrieved from the storage elements. Block 504 illustrates that, in one embodiment, that this block metadata (BLKMD) may be organized. In one embodiment, this may include sorting the metadata by file identifier (ID), then block order, then the power cycle in which they were written, and then the time stamp of the write. It is understood that the above is merely one illustrative example to which the disclosed subject matter is not limited.

Blocks 505 and 507 illustrate that, in one embodiment, that the remainder of the technique 500 may be carried out for each file or file ID. In such an embodiment, the technique 500 may systematically step through each file, locating the most recent version of that file, and building the block information map one file at a time. It is understood that the above is merely one illustrative example to which the disclosed subject matter is not limited.

In one embodiment, during the technique 500 each block (of data) may be categorized, tagged, or colored into three groups. "Unknown" blocks include blocks that have not been processed or need further processing. "Candidate" blocks include blocks that have been detected as possibly belonging to the current file or write iteration of processing, but whose status is not fully determined. "Finalized" blocks include blocks that are determined to be associated with the current file/write iteration and are part of the file. It is understood that the above are merely a few illustrative examples to which the disclosed subject matter is not limited.

Block 508 illustrates that, in one embodiment, the blocks associated with the current file ID may be searched to determine which of them has the highest power cycle or time stamp (in their metadata). As described above, these blocks may all be part of the last version of the file written to the drive.

Block 516 illustrates that, in one embodiment, during the same write operation, all of these blocks may be marked as candidate blocks. In various embodiments, files may be written in contiguous blocks. Therefore, from the first block to the last block in the group of blocks for this write operation, there should be no unknown blocks in-between.

Block 518 illustrates that, in one embodiment, the range of the write operation may be retrieved. In one embodiment, this may include the employment of the metadata parameters detailing the first and last blocks of this write.

Block 520 illustrates that, in one embodiment, the range of blocks in the write may be checked for "Unknown" blocks. In such an embodiment, "Finalized" blocks may be allowed, as later write operations may have updated particular blocks, and those later write operations may have been processed in a prior iteration of technique 500.

In various embodiments, Block 522 illustrates that, in one embodiment, a determination may be made as to whether or not any "Unknown" blocks interposed in the range of the given write operation. Block 524 illustrates that, in one embodiment, if Unknown blocks are encountered (an error), the entire block range may be marked as "Unknown".

Block 514 illustrates that, in one embodiment, if the write was not fully completed, then the metadata associated with the incomplete write may be discarded (and the partial file version no longer recoverable).

Blocks 515 and 513 illustrate that, in one embodiment, that the process may repeat (return to Block 516) if there are older written versions of the file ID. In such an embodiment, the technique 500 may look for a version of the file that has been fully written.

Block 526 illustrates that, in one embodiment, if no Unknown blocks are found, further metadata checks may be made. For example, in various embodiments, some checks may include checking that if the previous block parameter or field is a finalized block, then the next block ID of the previous block should equal the current block's ID. Another example may be, if the next block is a finalized block, the previous block ID of the next block should equal the current block's ID. Similar secondary or tautological checks may be made.

Block 528 illustrates that, in one embodiment, that a determination may be made as to whether the further or extra metadata checks were correct. If not, as shown in Block 524 the candidate blocks may be marked as Unknown (effectively abandoning these corrupt data blocks), and the next interaction may occur. If so, Block 530 illustrates that, in one embodiment, that the data blocks may be marked as Finalized (or correct) and the next iteration of technique 500 may proceed.

Block 532 illustrates that, in one embodiment, that further iterations of technique 500 may continue until all blocks of the file are finalized or otherwise processed. If all blocks of the file are finalized, it will continue on block 505 to see if more file ID needs to be processed, otherwise it will continue on block 515 to look for more write versions of the file.

Block 534 illustrates that, in one embodiment, if all blocks of a file may not be properly Finalized and no more write version exists (e.g., Block 515), an error may be reported.

As described above, the technique 500 may involve a number of iterations over not only files but version of those files to find as many recoverable files as possible, and the most recent complete versions of those files. In such an embodiment, the block information map may be rebuilt file by file and write operation by write operation. It is understood that the above is merely one illustrative example to which the disclosed subject matter is not limited.

FIG. 6 is a schematic block diagram of an information processing system 600, which may include semiconductor devices formed according to principles of the disclosed subject matter.

Referring to FIG. 6, an information processing system 600 may include one or more of devices constructed according to the principles of the disclosed subject matter. In another embodiment, the information processing system 600 may employ or execute one or more techniques according to the principles of the disclosed subject matter.

In various embodiments, the information processing system 600 may include a computing device, such as, for example, a laptop, desktop, workstation, server, blade server, personal digital assistant, smartphone, tablet, and other appropriate computers or a virtual machine or virtual computing device thereof. In various embodiments, the information processing system 600 may be used by a user (not shown).

The information processing system 600 according to the disclosed subject matter may further include a central processing unit (CPU), logic, or processor 610. In some embodiments, the processor 610 may include one or more functional unit blocks (FUBs) or combinational logic blocks (CLBs) 615. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 600 according to the disclosed subject matter may further include a volatile memory 620 (e.g., a Random Access Memory (RAM)). The information processing system 600 according to the disclosed subject matter may further include a non-volatile memory 630 (e.g., a hard drive, an optical memory, a NAND or Flash memory). In some embodiments, either the volatile memory 620, the non-volatile memory 630, or a combination or portions thereof may be referred to as a "storage medium". In various embodiments, the volatile memory 620 and/or the non-volatile memory 630 may be configured to store data in a semi-permanent or substantially permanent form. In various embodiments, one or more of the memories 620 and 630 may communicate via the Non-Volatile Memory Host Controller Interface Specification (NVMHCIS), such as, NVM Express (NVMe) and/or NVM Express over Fabrics (NVMe-oF).

In various embodiments, the information processing system 600 may include one or more network interfaces 640 configured to allow the information processing system 600 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+), International Mobile Telecommunications-2020 standard (a.k.a. cellular 5G). Examples of a wired protocol may include, but are not limited to, IEEE 802.3 (a.k.a. Ethernet), Fibre Channel, Power Line communication (e.g., HomePlug, IEEE 1901). It is understood that the above are merely a few illustrative examples to which the disclosed subject matter is not limited.

The information processing system 600 according to the disclosed subject matter may further include a user interface unit 650 (e.g., a display adapter, a haptic interface, a human interface device). In various embodiments, this user interface unit 650 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 600 may include one or more other devices or hardware components 660 (e.g., a display or monitor, a keyboard, a mouse, a camera, a fingerprint reader, a video processor). It is understood that the above are merely a few illustrative examples to which the disclosed subject matter is not limited.

The information processing system 600 according to the disclosed subject matter may further include one or more system buses 605. In such an embodiment, the system bus 605 may be configured to communicatively couple the processor 610, the volatile memory 620, the non-volatile memory 630, the network interface 640, the user interface unit 650, and one or more hardware components 660. Data processed by the processor 610 or data inputted from outside of the non-volatile memory 630 may be stored in either the non-volatile memory 630 or the volatile memory 620.

In various embodiments, the information processing system 600 may include or execute one or more software components 670. In some embodiments, the software components 670 may include an operating system (OS) and/or an application. In some embodiments, the OS may be configured to provide one or more services to an application and manage or act as an intermediary between the application and the various hardware components (e.g., the processor 610, a network interface 640) of the information processing system 600. In such an embodiment, the information processing system 600 may include one or more native applications, which may be installed locally (e.g., within the non-volatile memory 630) and configured to be executed directly by the processor 610 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 610.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit). In various embodiments, the logic circuitry may be included as part of the storage device, as described above.

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting but are illustrative only. Thus, the scope of the disclosed concepts is to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
    a storage element configured to store both data and metadata, wherein a first data is associated with and stored with a corresponding piece of metadata, and wherein the storage element tracks the location of the first data according to a block information map; and
    a processor configured to, in response to the first data being written to the apparatus:
        generate a piece of metadata that includes a set of parameters to facilitate an at least partial repair of the block information map, and
        store the piece of metadata alongside the first data,
    wherein the piece of metadata enables reconstructing a file system.

2. The apparatus of claim 1, wherein the processor is configured to:
    compute, at least in part, upon the first data, a hash code to correct an error in the first data.

3. The apparatus of claim 1, wherein the set of parameters includes at least two of the following sub-sets of parameters:

a first sub-set of parameters that include ordering information associated with the first data;
a second sub-set of parameters that include information that links the first data with at least one other data; and
a third sub-set of parameters that include information about a size of the first data.

4. The apparatus of claim 3, wherein the first sub-set of parameters include at least one field selected from a group comprising: a time stamp, a file memory block order identifier, and a file identifier;
wherein the second sub-set of parameters include at least one field selected from a group comprising: a previous memory block identifier, a next memory block identifier, and at least one block order write identifier; and
wherein the third sub-set of parameters include at least one field selected from a group comprising: a total file memory block size, and an amount of a memory block used indicator.

5. The apparatus of claim 1, wherein the apparatus comprises a write buffer and a cache memory; and
wherein the processor is configured to:
determine a memory block in the storage element associated with the first data,
copy a first piece of metadata associated with the memory block to the cache memory,
determine a validity of the memory block,
copy the first data from the write buffer to the cache memory,
compute a second piece of metadata, based upon the first data, in the cache memory, and
store the second piece of metadata and the first data to the storage element at the memory block.

6. The apparatus of claim 1, wherein the processor is configured to, in response to a read request for a second data:
retrieve, from the storage element, a second metadata associated with the second data, and
extract, from the second metadata a size parameter,
generate a hash code based, at least in part, upon the size parameter, and
validate the second data using, at least in part, the hash code.

7. The apparatus of claim 1, wherein the processor is configured to, in response to a request to rebuild the block information map:
retrieve a plurality of metadata, wherein the plurality of metadata is associated with respective pieces of data;
sort the metadata by one or more identifiers;
determine at least one piece of metadata that is invalid;
remove, from the plurality of metadata, pieces of metadata that are invalid; and
rebuild the block information based upon the plurality of metadata.

8. The apparatus of claim 7, wherein the processor is configured to, remove pieces of metadata that are invalid, by:
determining a completion state of a write operation associated with a respective piece of metadata;
determining a most recent completed write operation associated with the respective piece of metadata of a completed write operation associated with the respective piece of metadata is; and
marking the most recent completed write operation associated with the respective piece of metadata as valid.

9. An apparatus comprising:
a storage element configured to store both data and metadata, wherein a first data is associated with and co-stored with a corresponding first metadata, and wherein the storage element is configured to track the location of the first data according to a block information map; and
a processor configured to, in response to a request to rebuild the block information map:
retrieve a plurality of metadata, wherein the plurality of metadata is associated with data;
sort the metadata by one or more identifiers;
determine if at least one piece of metadata is invalid;
remove, from the plurality of metadata, pieces of metadata that are invalid; and
rebuild the block information based upon the plurality of metadata.

10. The apparatus of claim 9, wherein the processor is configured to, remove pieces of metadata that are invalid, by:
determining a completion state of a write operation associated with a respective piece of metadata;
determining a most recent completed write operation associated with the respective piece of metadata of a completed write operation associated with the respective piece of metadata; and
marking the most recent completed write operation associated with the respective piece of metadata as valid.

11. The apparatus of claim 9, wherein the set of parameters includes at least one of the following sub-sets of parameters:
a first sub-set of parameters that include ordering information associated with the first data;
a second sub-set of parameters that include information that links the first data with at least one other data; and
a third sub-set of parameters that include information about a size of the first data.

12. The apparatus of claim 11, wherein the first sub-set of parameters include at least one fields selected from a group comprising: a time stamp, a file memory block order identifier, and a file identifier;
wherein the second sub-set of parameters include at least one field selected from a group comprising: a previous memory block identifier, a next memory block identifier, and at least one block order write identifier; and
wherein the third sub-set of parameters include at least one field selected from a group comprising: a total file memory block size, and an amount of a memory block used indicator.

13. The apparatus of claim 11, wherein the processor is configured to, in response to a piece of data being written to the apparatus:
generate a piece of metadata that includes a set of parameters to facilitate an at least partial repair of the block information map, and
store the piece of metadata alongside the first data.

14. The apparatus of claim 13, wherein the apparatus comprises a write buffer and a cache memory; and
wherein the processor is configured to, in response to the first data being written to the apparatus:
determine a memory block in the storage element associated with the piece of data,
copy a first piece of metadata associated with the memory block to the cache memory,
determine a validity of the existing memory block,
copy the first data from the write buffer to the cache memory,
compute a second piece of metadata, based upon the first data, in the cache memory, and
store the second piece of metadata and the first data to the storage element at the memory block.

15. The apparatus of claim 9, wherein the processor is configured to, in response to a read request for a second data:
  retrieve from the storage element, a second metadata associated with the piece of data, and
  extract, from the second metadata a size parameter,
  generate a hash code based, at least in part, upon the size parameter, and
  validate the second data using, at least in part, the hash code.

16. The apparatus of claim 9, wherein for the first data, the metadata, is stored as a header field with the piece data.

17. The apparatus of claim 9, wherein each piece of metadata further includes a hash code configured to facilitate error detection upon the associated piece of data.

18. A system comprising:
  a first processor configured to read and write pieces of data from a storage device; and
  a storage device comprising:
    a storage element configured to store both data and metadata, wherein a first data is associated with and stored with a corresponding first metadata, and wherein the storage element is configured to track the location of the first data according to a block information map; and
    a second processor configured to:
      generate and manage the first metadata,
      in response to a write request for a second data, update and store an associated second metadata in the same memory block as the first data, and
      rebuild, at least partially, a block information map in a file system based, at least in part, upon the one or more metadata.

19. The system of claim 18, wherein the second processor is configured to, in response to a read request for a piece of data:
  retrieve from the storage element, the first metadata associated with the first data, and
  extract, from the first metadata a size parameter,
  generate a hash code based, at least in part, upon the size parameter, and
  validate the first data using, at least in part, the hash code.

20. The system of claim 18, wherein the controller processor is configured to, in response to a request to rebuild the block information map:
  retrieve a plurality of metadata, wherein the plurality of metadata each are associated with respective pieces of data;
  sort the metadata by one or more identifiers;
  determine whether at least one piece of metadata is invalid;
  remove, from the plurality of metadata, pieces of metadata that are invalid; and
  rebuild the block information based upon the plurality of metadata.

* * * * *